(12) United States Patent
Kim (10) Patent No.: US 7,865,930 B2
(45) Date of Patent: Jan. 4, 2011

(54) METHOD AND APPARATUS PROVIDING CHANNEL MANAGEMENT IN A MULTI-FREQUENCY NETWORK BROADCASTING SYSTEM

(75) Inventor: Dong-won Kim, Seoul (KR)

(73) Assignee: Samsung Electronics Co., Ltd, Suwon-si (KR)

(*) Notice: Subject to any disclaimer, the term of this patent is extended or adjusted under 35 U.S.C. 154(b) by 1455 days.

(21) Appl. No.: 10/842,464

(22) Filed: May 11, 2004

(65) Prior Publication Data

US 2004/0244050 A1   Dec. 2, 2004

(30) Foreign Application Priority Data

May 27, 2003   (KR)   ...................... 10-2003-0033838

(51) Int. Cl.
   *H04N 7/173*   (2006.01)
(52) U.S. Cl. .................................................... 725/151
(58) Field of Classification Search ................. 725/119, 725/124–125, 127–128; 370/328–332, 201, 370/241, 253, 431, 437, 464, 465; 455/450, 455/452.2; 375/345, 224, 227; 324/76.11, 324/76.12, 76.13; 700/1, 11, 28, 32, 90; 702/1, 57, 66, 69, 127, 187, 189
   See application file for complete search history.

(56) References Cited

U.S. PATENT DOCUMENTS

| | | | |
|---|---|---|---|
| 4,476,582 A | | 10/1984 | Strauss et al. |
| 5,203,027 A | * | 4/1993 | Nounin et al. ............... 455/134 |
| 5,565,932 A | * | 10/1996 | Citta et al. .................. 348/678 |
| 6,061,553 A | * | 5/2000 | Matsuoka et al. ........... 455/273 |
| 6,130,898 A | | 10/2000 | Kostreski |
| 6,389,070 B1 | * | 5/2002 | Cugnini et al. .............. 375/232 |
| 6,539,214 B1 | * | 3/2003 | Lapaille et al. ........... 455/226.3 |
| 7,061,996 B2 | * | 6/2006 | Kim ........................... 375/321 |
| 2004/0198265 A1 | * | 10/2004 | Wallace et al. .............. 455/118 |

FOREIGN PATENT DOCUMENTS

| | | |
|---|---|---|
| EP | 0800313 A2 | 10/1997 |
| JP | 10-224705 | 8/1998 |
| JP | 11027104 A | 1/1999 |
| JP | 11112294 A | 4/1999 |
| JP | 2001-44803 A | 2/2001 |
| JP | 2001-217735 A | 8/2001 |
| KR | 2000-021581 | 4/2000 |

(Continued)

OTHER PUBLICATIONS

TDA8960 Specification Sheet, Jun. 1999.*

*Primary Examiner*—Andrew Y Koenig
*Assistant Examiner*—Alfonso Castro
(74) *Attorney, Agent, or Firm*—Stanzione & Kim LLP (57) ABSTRACT

A method and apparatus providing channel management in a broadcast receiver. The method includes estimating an intensity and a signal-to-noise ratio (SNR) of broadcast signals received via a plurality of physical channels (PCT channels) in a channel memory mode, determining reception quality of the respective plurality of PCT channels, in consideration of both the estimated intensity and SNR of the broadcast signals, and assigning the plurality of PCT channels to a virtual channel (VCT channel) according to a predetermined rule with respect to a reception quality of the plurality of PCT channels.

20 Claims, 7 Drawing Sheets

FOREIGN PATENT DOCUMENTS

| | | |
|---|---|---|
| KR | 2000-027976 | 5/2000 |
| KR | 2000-045190 | 7/2000 |
| KR | 2000-045191 | 7/2000 |
| KR | 2001-018220 | 3/2001 |
| KR | 2001-046208 | 6/2001 |
| WO | WO 0128093 A1 * | 4/2001 |

* cited by examiner

METHOD AND APPARATUS PROVIDING CHANNEL MANAGEMENT IN A MULTI-FREQUENCY NETWORK BROADCASTING SYSTEM

CROSS-REFERENCE TO RELATED APPLICATIONS

This application claims the priority of Korean Patent Application No. 2003-33838, filed on May 27, 2003, in the Korean Intellectual Property Office, the disclosure of which is incorporated herein in its entirety by reference.

BACKGROUND OF THE INVENTION

1. Field of the Invention

The present invention relates to a method and apparatus providing channel management in a broadcasting system, and more particularly, to a method and apparatus providing channel management in a multi frequency network broadcasting system, which manage physical channels to be selected in a priority order of reception quality to tune in a broadcast program in a multi frequency network broadcasting environment of digital broadcasting systems.

2. Description of the Related Art

Generally, broadcast methods include a single frequency network (SFN) broadcast method and a multi frequency network (MFN) broadcast method.

Figure 1A:
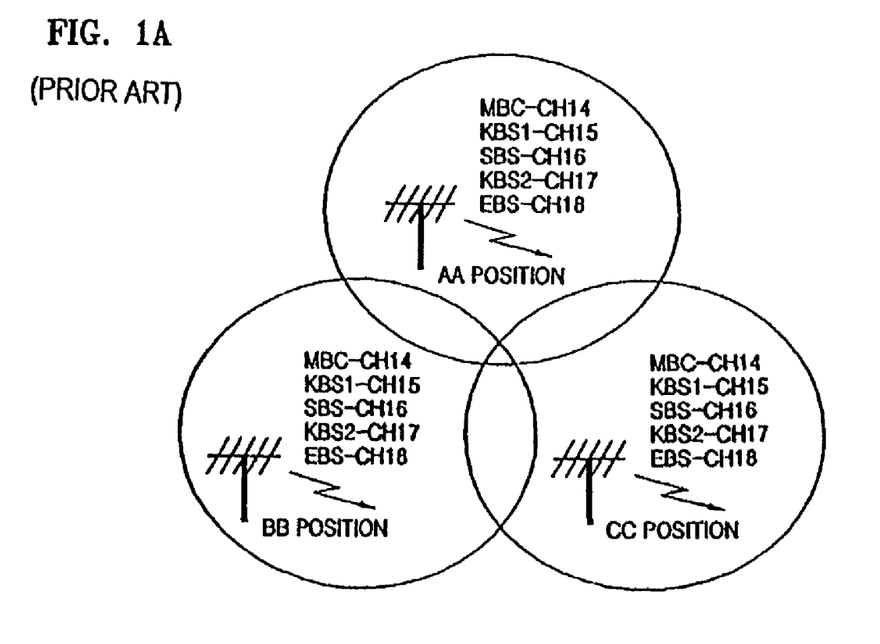
FIG. 1A shows a part of an exemplary single frequency network (SFN) broadcasting system.
Figure 1B:
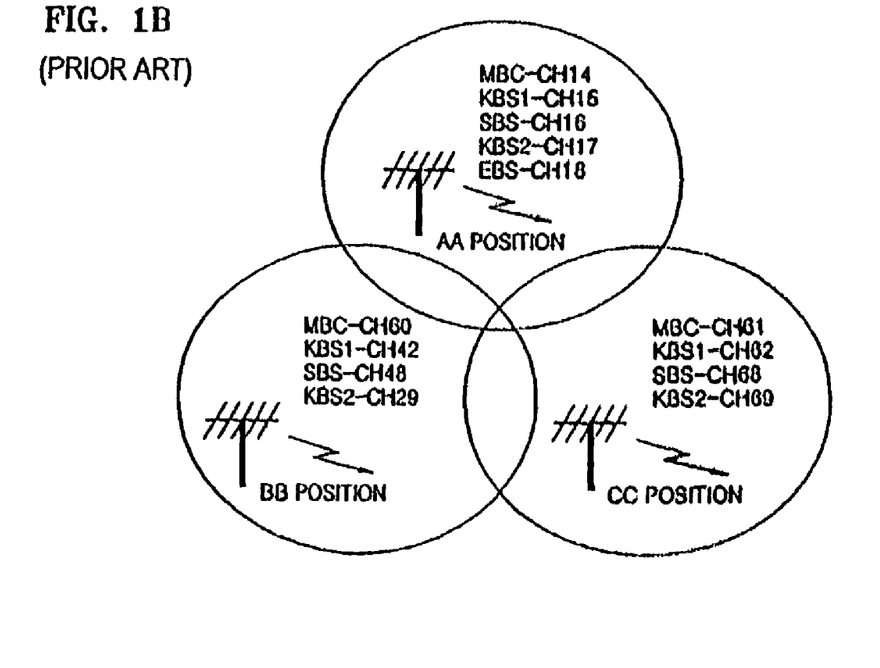
FIG. 1B shows a part of an exemplary multi frequency network (MFN) broadcasting system.

In the SFN broadcast method, as shown in FIG. 1A, local transmitting stations air the same broadcast signals using the same frequency, regardless of their regions. On the other hand, in the MFN broadcast method, as shown in FIG. 1B, local transmitting stations air the same broadcast signals using different frequencies according to their regions.

Referring to FIG. 1A, for example, when the local transmitting stations are located on AA position, BB position, and CC position, so called MBC programs are aired by all local transmitting stations on channel 14 according to the SFN broadcast method. Meanwhile, as shown in FIG. 1B, according to the MFN broadcast method, one local transmitting station that is located on AA position airs the MBC programs on channel 14, another local transmitting station located on BB position airs the MBC programs on channel 60, and another local transmitting station located on CC position airs the MBC programs on channel 61.

Figure 2A:
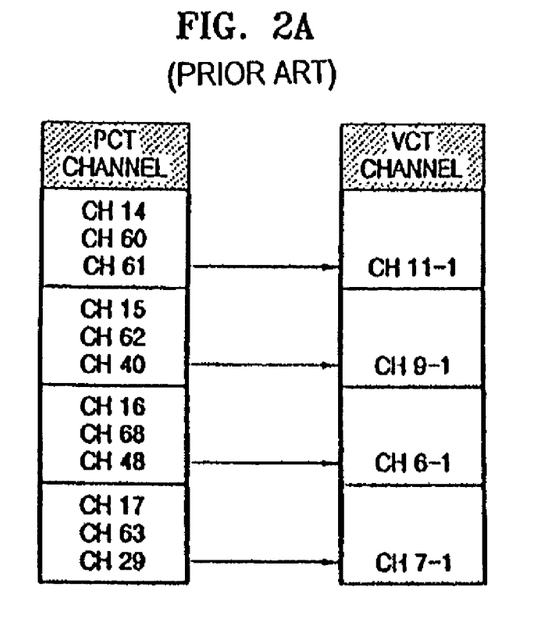
FIGS. 2A and 2B are examples of assigning a plurality of physical channels (PCT channels) for a broadcast program to a virtual channel (VCT channel)

In the MFN broadcast method, virtual channels are assigned by a conventional broadcast receiver as described below in case 1 and case 2:

1) As shown in FIG. 2A, when a single broadcast program is received via a plurality of physical channels (PCT channels), the last received channel of the plurality of PCT channels is assigned to a virtual channel (VCT channel) that will be used later by a user to tune in the broadcast program via PCT channels.

Figure 2B:
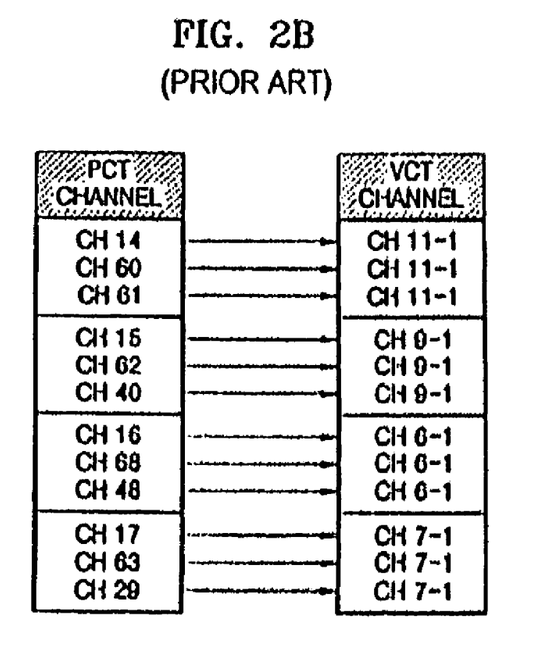

2) As shown in FIG. 2B, when a single broadcast program is received via a plurality of PCT channels, all PCT channels are assigned to a VCT channel to be used later by a user.

However, the channel assignment method according to case 1), as shown in FIG. 2A, assigns the last received channel of the plurality of PCT channels for a single broadcast program to a VCT channel without considering the conditions of the PCT channels, so that a channel of poor quality may be assigned to the VCT channel.

The channel assignment method according to case 2), as shown in FIG. 2B, assigns all PCT channels carrying the single broadcast program to a VCT channel in the reception order, so that fine reception quality of the VCT channel may not be guaranteed.

SUMMARY OF THE INVENTION

Accordingly, it is an aspect of the general inventive concept to provide a method and apparatus providing channel management in a multi frequency network (MFN) broadcasting system, in which a finest reception channel among a plurality of physical channels (PCT channels) is assigned with priority to a virtual channel (VCT channel) by considering a signal intensity and a signal-to-noise ratio (SNR) of broadcast signals carried on the PCT channels in the MFN broadcasting system.

Additional aspects and advantages of the present general inventive concept will be set forth in part in the description which follows and, in part, will be obvious from the description, or may be learned by practice of the general inventive concept.

The foregoing and/or other aspects of the present general inventive concept are achieved by providing a method of channel management in a broadcast receiver, the method may include, estimating an intensity and a signal-to-noise ratio (SNR) of broadcast signals received via a plurality of physical channels (PCT channels) in a channel memory mode, determining reception quality of the respective plurality of PCT channels, in consideration of both the estimated intensity and SNR of the broadcast signals, and assigning the plurality of PCT channels to a virtual channel (VCT channel) according to a predetermined rule with respect to a reception quality of the plurality of PCT channels.

It is an aspect of the general inventive concept that the intensity of the broadcast signals can be estimated by controlling a gain value of an automatic gain control circuit that processes the received broadcast signals.

It is another aspect of the general inventive concept that the reception quality of the PCT channels can be determined by multiplying the intensity and SNR values by first and second weight values, respectively, and combining the results.

It is another aspect of the general inventive concept that the predetermined rule with respect to the reception quality of the plurality of PCT channels can be arranged to assign one of the plurality of PCT channels that has the best reception quality to the VCT channel for the received broadcast signals.

It is another aspect of the general inventive concept that the predetermined rule with respect to the reception quality of the plurality of PCT channels can be arranged to assign the plurality of PCT channels to the VCT channel in the order of the priority of the reception quality of the PCT channels for the received broadcast signals.

The foregoing and/or other aspects of the general inventive concept may also be achieved by providing a broadcast receiver including a tuner which can tune in and output broadcast signals via some physical channels (PCT channels), an automatic gain control (AGC) amplifier which can automatically control and amplify a gain of the broadcast signals output by the tuner, an analog-to-digital converter which can convert the broadcast signals in an analog form output by the AGC amplifier to digital signals, a digital demodulator which can demodulate the digital signals according to a predetermined rule so as to recover synchronous signals and then recover transmitted symbols using the synchronous signals, an intensity estimator which can estimate an intensity value of the broadcast signals, the intensity value being inversely proportional to the gain of the broadcast signals amplified by the AGC amplifier, a signal-to-noise ratio (SNR) operation unit which can obtain an SNR value of the digital signals, using the symbols recovered by the digital demodulator, and a controller which can calculate a reception quality of the broadcast signals by combining the intensity and the SNR values multiplied by a first and a second weights, respectively, and can assign a virtual channel for the same broadcast signals received via the PCT channels according to a predetermined channel management rule.

It is an aspect of the general inventive concept that the predetermined channel management rule with respect to the reception quality of the plurality of PCT channels can be arranged to assign one of the plurality of PCT channels that has the best reception quality to the VCT channel for the received broadcast signals.

It is another aspect of the general inventive concept that the predetermined channel management rule with respect to the reception quality of the plurality of PCT channels can be arranged to assign the plurality of PCT channels to the VCT channel in the order of the priority of the reception quality of the PCT channels for the received broadcast signals.

It is another aspect of the general inventive concept that the SNR operation unit can include, an accumulator which can accumulate the symbols recovered by the digital demodulator, an absolute value generator which can obtain an absolute value of the result output by the accumulator, a first adder which can add absolute values in a predetermined period, output by the absolute value generator, a first mean value generator which can obtain a mean value of the absolute values in the predetermined period, output by the absolute value generator, a second square value generator which can obtain an absolute mean square value by squaring the mean value output by the first mean value generator, a first square value generator which obtains a square value of the result output by the accumulator, a second adder which can add square values in the predetermined period, output by the first square value generator, a second mean value generator which can obtain a square mean value by averaging the square values in the predetermined period, output by the second adder, and a variance and signal-to-noise ratio (SNR) calculator which can obtain a variance by calculating a difference between the absolute mean square value output by the second square value generator and the square mean value output by the second mean value generator, and obtains an SNR value, which is a ration of the absolute mean square value to the variance.

It is another aspect of the general inventive concept that the predetermined period can be one frame.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
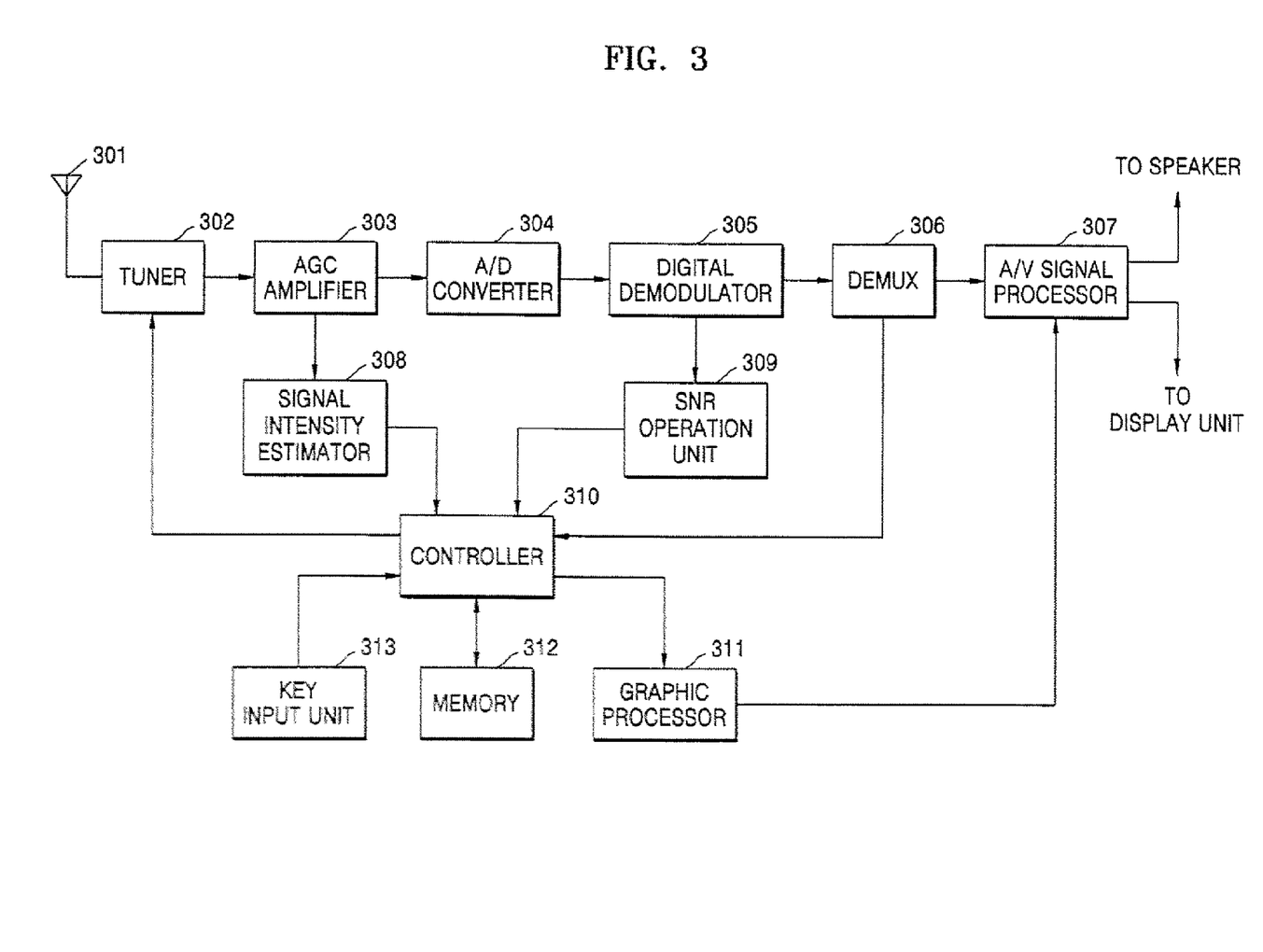
FIG. 3 is a schematic block diagram of a television providing channel management according to an embodiment the present general inventive concept.

Referring to FIG. 3, a television, i.e., a broadcast receiver providing channel management according to an embodiment of the general inventive concept can include an antenna 301, a tuner 302, an automatic gain control (AGC) amplifier 303, an analog-to-digital converter (ADC) 304, a digital demodulator 305, a demultiplexer (DEMUX) 306, an audio/video (AN) signal processor 307, a signal intensity estimator 308, a SNR operation unit 309, a controller 310, a graphics processor 311, a memory 312, and a key input unit 313.

The tuner 302 can tune to a physical channel frequency on which a broadcast signal is carried, according to a channel tuning control signal generated by the controller 310. After tuning, the tuner 302 can change the physical channel frequency carrying the broadcast signal into an intermediate frequency and can output the tuned broadcast signal with the intermediate frequency.

The AGC amplifier 303 can perform automatic gain control on the broadcast signal with the intermediate frequency to amplify the broadcast signal to a fixed amplitude irrespective of the signal intensity. If the intensity of the broadcast signal is high, then the gain of the AGC amplifier 303 is lowered to obtain the fixed amplitude of the broadcast signal, otherwise, the gain is increased to reach the fixed amplitude of the broadcast signal.

The signal intensity estimator 308 can estimate an intensity of the broadcast signal using the gain set by the AGC amplifier 303. In the signal intensity estimator 308, the gain set by the AGC amplifier 303 is inversely proportional to the intensity of the broadcast signal to estimate the intensity of the broadcast signal.

The ADC 304 can convert the broadcast signal in the analog form amplified by the AGC amplifier 303 into a digital broadcast signal.

The digital demodulator 305 can demodulate the digital broadcast signal output by the ADC 304, according to, e.g., a Vestigial Side Band (VSB) scheme, to restore a synchronous signal and then restore a transmitted symbol using the synchronous signal. A detailed arrangement of the digital demodulator 305 is shown in FIG. 4.

Figure 4:
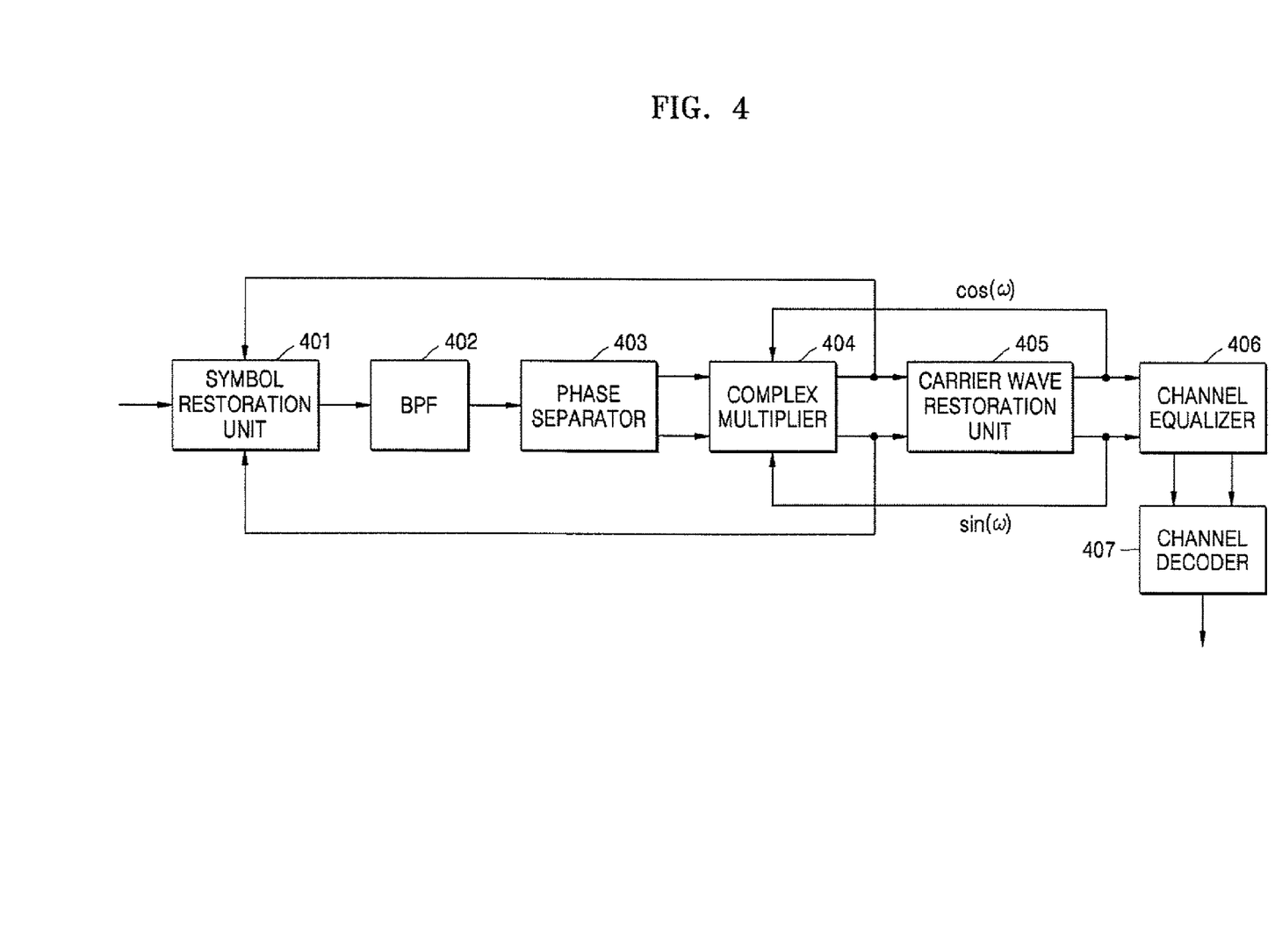
FIG. 4 is a detailed block diagram of a digital demodulator of the television of FIG. 3.

Referring to FIG. 4, the digital demodulator 305 can include a symbol restoration unit 401, a band pass matched filter (BPF) 402, a phase separator 403, a complex multiplier 404, a carrier wave restoration unit 405, channel equalizer 406, and a channel decoder 407.

The symbol restoration unit 401 can receive a timing error signal of the present symbols, which is fed back from the complex multiplier 404 performing base band signal processing using a reproduction sampler, and can interpolate the digital broadcast signals received from the ADC 304 by decreasing the error between the digital broadcast signals to obtain digital broadcast signals in synchronization with the symbols.

The BPF 402 can filter the digital broadcast signals in synchronization with the symbols, output by the symbol restoration unit 401, so as to readjust an SNR of the digital broadcast signals to be a maximum at the symbol positions.

The phase separator 403 can divide an I signal and a Q signal from the signal filtered by the BPF 402.

The complex multiplier 404 can receive carrier waves cos (ω) and sin(ω) that are restored at and fed back from the carrier wave restoration unit 405, and can multiply the I and the Q signals output by the phase separator 403 by those carriers, resulting in I and Q signals lowered to a base band (base band signals).

The carrier wave restoration unit 405 can eliminate frequency offsets and phase noises of the carrier waves from the base band signals output by the complex multiplier 404.

The channel equalizer 406 can eliminate an inter-symbol interference due to multi paths, from the signal restored by the carrier wave restoration unit 405.

The channel decoder 407 can eliminate channel noise from the signal output by the channel equalizer 406, and then can recover a synchronous signal from the base band I signal in which the synchronous signal had been inserted in time of transmission, and also can restore the transmitted symbol, or symbol data using the synchronous signal.

Referring back to FIG. 3, the SNR operation unit 309 can calculate the SNR of the symbol output by the digital modulator 305. A detailed arrangement of the SNR operation unit 309 is shown in FIG. 5.

Figure 5:
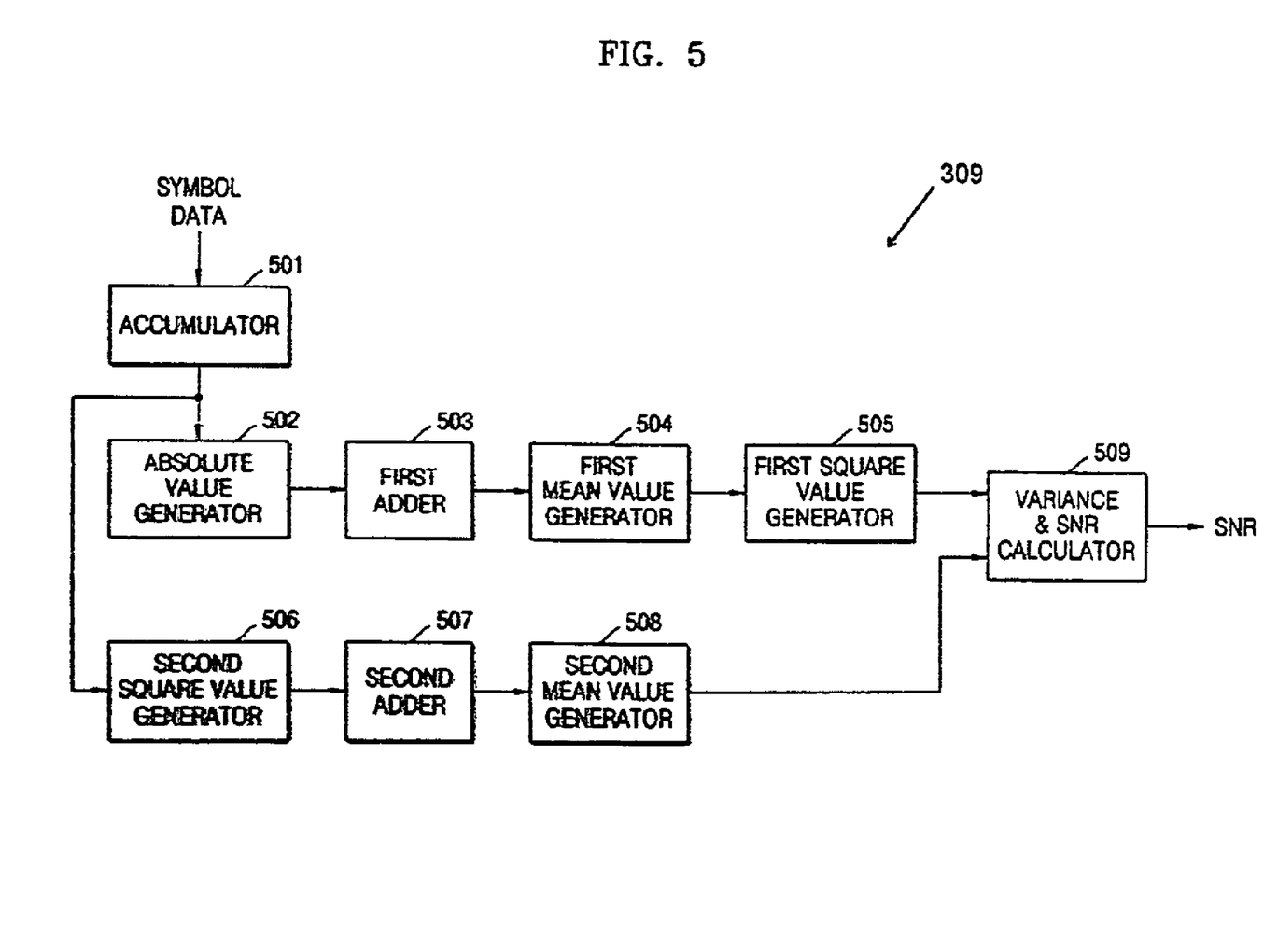
FIG. 5 is a detailed block diagram of a signal-to-noise ratio (SNR) operation unit of the television of FIG. 3.

As shown in FIG. 5, the SNR operation unit 309 can include an accumulator 501, an absolute value generator 502, first and second adders 503 and 507, first and second mean value generators 504 and 508, first and second square value generators 505 and 506, and a variance and SNR calculator 509.

The symbol data restored by the digital demodulator 305 can be sent to the accumulator 501, in which it can be cumulatively summed and the resulting value can be branched to the first path to obtain a mean square value and to the second path to obtain a square mean value.

In the first path to obtain the mean square value, an absolute value of the accumulated symbol data output by the accumulator 501 can be obtained in the absolute value generator 502. Absolute values during a frame are added in the adder 503, and the result can be used to obtain a mean value of the frame in the first mean value generator 504. The mean value output by the first mean value generator 504 can be sent to the first square value generator 505, in which the mean value can be squared to be output as the mean square value.

In the second path to obtain the square mean value, the accumulated symbol data output by the accumulator 501 can be squared in the second square value generator 506. Square values during the frame, which are output by the second square value generator 506, can be added in the second adder 507. The second mean value generator 508 can calculate the mean value of the result of adding the square values during the frame.

The mean square value from the first path and the square mean value from the second path can be used in the variance and SNR calculator 509 to obtain the variance and SNR of symbol data during the frame. The variance is a difference between the mean square value and the square mean value, and the SNR is a ratio of the mean square value to the variance.

Referring back to FIG. 3, the symbol data restored by the digital demodulator 305 can also be sent to the DEMUX 306 in which the symbol data can be split into video data, audio data and additional information data.

The audio/video signal processor 307 can decode and convert the audio and video data into corresponding audio/video analog signals, and can output them to a speaker and display unit (not shown), respectively.

The additional information data can be graphically processed by the controller 310 and the graphics processor 311, and then combined with the video signal that is processed by the audio/video signal processor 307 to be output to the display unit.

The key input unit 313 can include various kinds of instruction keys to operate the television, wherein key instructions input by a user are sent to the controller 310.

The memory 312 can store various programs and data to operate the television. Furthermore, the memory 312 can store a program and data used to realize the method of channel management in the MFN broadcasting system according to an embodiment of the general inventive concept, which will be described with reference to FIG. 6.

The controller 310 can control an overall operation of the television. In particular, the controller 310 can control overall components of the television to perform the program and data stored in the memory 312 used to realize the method of channel adjustment in the MFN broadcast system according to an embodiment of the general inventive concept.

Figure 6:
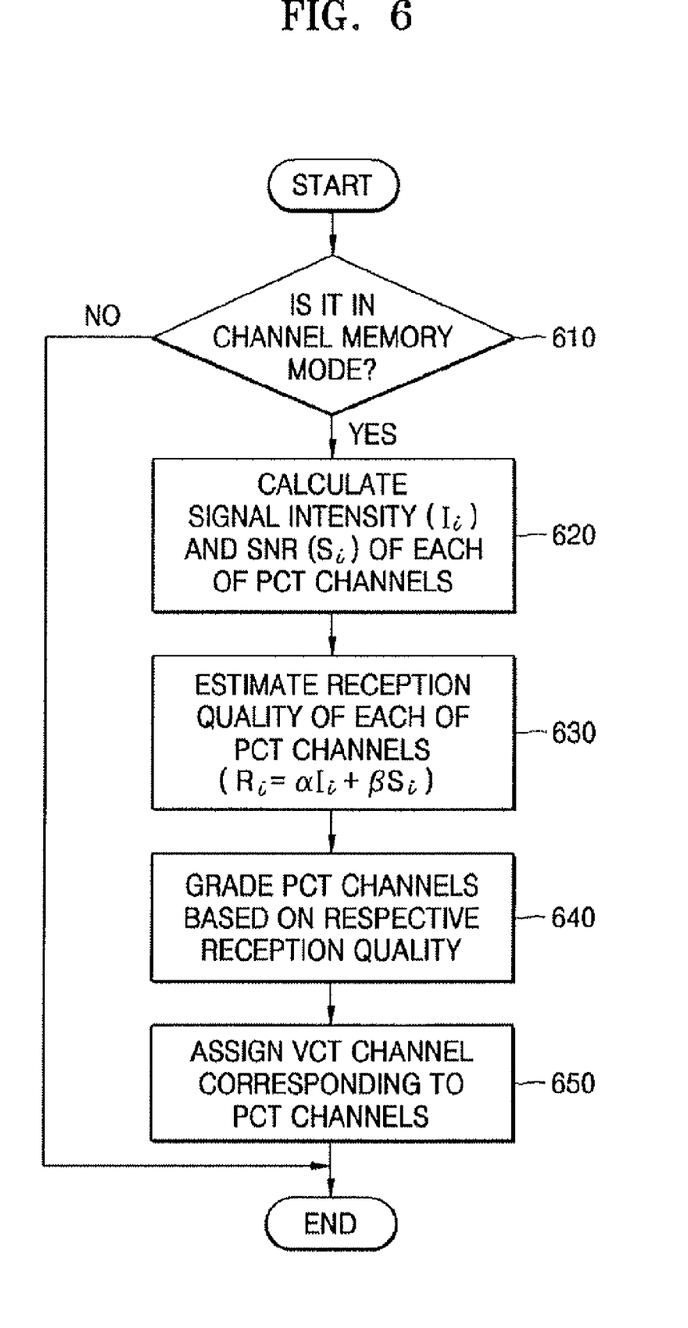
FIG. 6 is a flowchart of a method of channel management in an MFN broadcasting system, according to another embodiment of the present general inventive concept.

Referring to FIG. 6, the method of channel management according to this embodiment, performed by the controller 310, will be described below.

In operation 610, the controller 310 determines whether it is in a channel memory mode, which is initiated by a key instruction given by a user with, e.g., a remote control as the key input unit 313.

The channel memory mode may be divided into an automatic channel memory mode and a manual channel memory mode. In the automatic channel memory mode, all PCT channels carrying the same broadcast signals to the television (or the broadcast receiver) can be automatically searched and stored. At this time, the controller 310 can control the tuner 302 to sequentially tune to the PCT channels. Meanwhile, in the manual channel memory mode, the user manually selects channels to be stored in the memory, using the key input unit 313. The present general inventive concept can be applied to both the two channel memorize modes.

In the channel memory mode, the signal intensity estimator 308 and the SNR operation unit 309 can obtain a signal intensity $I_i$ and a signal to noise ratio $S_i$ of the signal on each of PCT channels, respectively, in operation 620.

Then, the controller 310 can receive the signal intensity $I_i$ and SNR $S_i$ of the signal on each of PCT channels, and can estimate a reception quality of each of PCT channels in operation 630.

The reception quality $R_i$ of each of the PCT channels is represented by equation 1, using the intensity $I_i$ and SNR $S_i$.

$$R_i = \alpha I_i + \beta S_i \quad (1)$$

where, α and β are predetermined weight factors, and i denotes a channel number. The weight factors α and β to respectively weigh the intensity $I_i$, and the SNR $S_i$ are experimentally determined in consideration of the status of the broadcast reception area.

After estimating the channel quality of each of the PCT channels, the controller 310 can compare each of estimated channel qualities of the PCT channels, and grades the PCT channels in terms of the channel quality, in operation 640.

Then, the controller 310 can assign a virtual channel (VCT channel) that corresponds to the PCT channels, referring to the PCT channel grades, according to rules 1 and 2 below for VCT channel assignment, in operation 650:

1) Select a PCT channel having the finest reception quality of the PCT channels on which the same broadcast programs are broadcasted, and assign the PCT channel to the VCT channel.

Figure 7A:
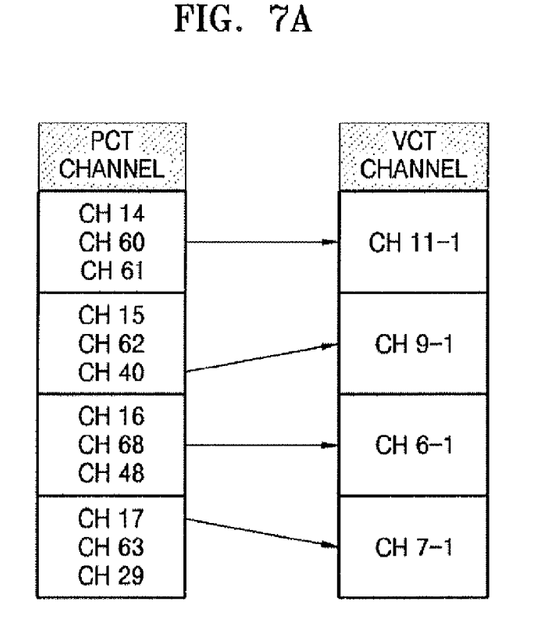
FIGS. 7A and 7B are examples of assigning a plurality of PCT channels for a broadcast program to a VCT channel, according to another embodiment of the present general inventive concept.

As shown in FIG. 7A, for example, if the same broadcast programs are received via PCT channels, such as CH14, CH60, and CH61, and CH60 is estimated as the channel having the best reception quality, CH60 is assigned to the VCT channel CH11-1 for the broadcast programs, which is a channel number allowing the user to select the PCT channel carrying broadcast programs with the key input unit 313, such as a remote control. After assigning the VCT channel, if the user selects the channel CH11-1 with the key input unit 313, the controller 310 can generate a control signal for the tuner 302 to tune to the PCT channel CH60 that corresponds to the VCT channel CH 11-1.

2) Assign PCT channels on which the same broadcast programs are broadcasted to a VCT channel in the priority order of the reception quality of the PCT channels.

Figure 7B:
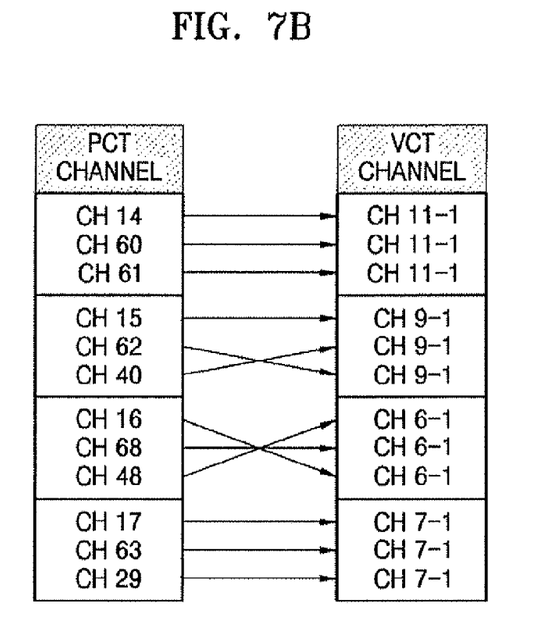

As shown in FIG. 7B, for example, if the same broadcast programs are received at a broadcast receiver via PCT channels CH15, CH62, and CH40, and the priority order of the reception quality of the PCT channels is CH15-CH40-CH62, the controller 310 can assign the PCT channels to a VCT channel CH9-1 in the same order.

As such, after assigning the VCT channel, when a user selects the channel CH9-1 using the key input unit 313, the controller 310 can first generate a channel control signal to tune to the PCT channel CH15, and can sequentially generate channel control signals to tune to the PCT channels Ch40 and CH62 as the same key instructions are sequentially input by the user.

The assignment relationship between VCT channels and corresponding PCT channels can be arranged in tabular form and stored in the memory 312.

As described above, in accordance with the present general inventive concept, when a same broadcast program is received via a plurality of PCT channels, VCT channel assignment is made in the priority order of the reception quality of the PCT channels, in consideration of the intensity and the SNR of broadcast signals, thereby allowing a user to watch selected broadcast programs with better reception quality.

The present general inventive concept can be realized as a method, an apparatus, or a system. When the present general inventive concept is manifested in computer software, components thereof may be replaced with code segments that are necessary to perform the required action. Programs or code segments may be stored in media readable by a processor. The media readable by a processor include anything that can store and transmit information, such as, electronic circuits, semiconductor memory devices, ROM, flash memory, EEPROM, floppy discs, optical discs, hard discs.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of channel management in a broadcast receiver, the method comprising:

estimating an intensity and a signal-to-noise ratio (SNR) of broadcast signals received via a plurality of physical channels (PCT channels) in a channel memory mode;

determining reception quality of the respective plurality of PCT channels, in consideration of both the estimated intensity and SNR of the broadcast signals, by multiplying the intensity and SNR values by first and second weight values, respectively, and combining the results; and assigning the plurality of PCT channels to a virtual channel (VCT channel) according to a predetermined rule with respect to a reception quality of the plurality of PCT channels.

2. The method of claim 1, wherein the intensity of the broadcast signals is estimated by controlling a gain value of an automatic gain control circuit that processes the received broadcast signals.

3. The method of claim 1, wherein the predetermined rule with respect to the reception quality of the plurality of PCT channels is arranged to assign one of the plurality of PCT channels that has the best reception quality to the VCT channel for the received broadcast signals.

4. The method of claim 1, wherein the predetermined rule with respect to the reception quality of the plurality of PCT channels is arranged to assign the plurality of PCT channels to the VCT channel in the order of the priority of the reception quality of the PCT channels for the received broadcast signals.

5. A method of managing channels in a broadcast receiver, comprising:

evaluating signal intensities and signal-to-noise ratios of broadcast signals carried on a plurality of physical channels (PCT channels); and assigning a reception channel, among the plurality of physical channels (PCT channels) evaluated, having the best quality to a virtual channel (VCT channel) in a multi-frequency network (MFN), wherein the best quality is determined based on signal intensity and signal-to-noise ratio by multiplying the intensity and signal-to-noise values by first and second weight values, respectively, and combining the results.

6. The method of claim 5, wherein the assigning of the PCT channels is performed in a priority order to the reception quality of the PCT channels.

7. A broadcast receiver comprising:

a tuner which tunes in and outputs broadcast signals via some physical channels (PCT channels);

an automatic gain control (AGC) amplifier which automatically controls and amplifies a gain of the broadcast signals output by the tuner;

an analog-to-digital converter which converts the broadcast signals in an analog form output by the AGC amplifier to digital signals;

a digital demodulator which demodulates the digital signals according to a predetermined rule so as to recover synchronous signals and then recover transmitted symbols using the synchronous signals;

an intensity estimator which estimates an intensity value of the broadcast signals, the intensity value being inversely proportional to the gain of the broadcast signals amplified by the AGC amplifier;

a signal-to-noise ratio (SNR) operation unit which obtains an SNR value of the digital signals, using the symbols recovered by the digital demodulator; and a controller which calculates a reception quality of the broadcast signals by combining the intensity and the SNR values multiplied by first and second weights, respectively, and assigns a virtual channel for the same broadcast signals received via the PCT channels according to a predetermined channel management rule.

8. The broadcast receiver of claim 7, wherein the predetermined channel management rule with respect to the reception quality of the plurality of PCT channels is arranged to assign one of the plurality of PCT channels that has the best reception quality to the VCT channel for the received broadcast signals.

9. The broadcast receiver of claim 7, wherein the predetermined channel management rule with respect to the reception quality of the plurality of PCT channels is arranged to assign the plurality of PCT channels to the VCT channel in the order of the priority of the reception quality of the PCT channels for the received broadcast signals.

10. The broadcast receiver of claim 7, wherein the SNR operation unit comprises:
    an accumulator which accumulates the symbols recovered by the digital demodulator;
    an absolute value generator which obtains an absolute value of the result output by the accumulator;
    a first adder which adds absolute values in a predetermined period, output by the absolute value generator;
    a first mean value generator which obtains a mean value of the absolute values in the predetermined period, output by the absolute value generator;
    a second square value generator which obtains an absolute mean square value by squaring the mean value output by the first mean value generator;
    a first square value generator which obtains a square value of the result output by the accumulator;
    a second adder which adds square values in the predetermined period, output by the first square value generator;
    a second mean value generator which obtains a square mean value by averaging the square values in the predetermined period, output by the second adder; and
    a variance and signal-to-noise ration (SNR) calculator which obtains a variance by calculating a difference between the absolute mean square value output by the second square value generator and the square mean value output by the second mean value generator, and obtains an SNR value, which is a ratio of the absolute mean square value to the variance.

11. The broadcast receiver of claim 10, wherein the predetermined period is one frame.

12. The broadcast receiver of claim 7, wherein the signal intensity estimator estimates the intensity value of the broadcast signals by using the gain set by the AGC amplifier.

13. The broadcast receiver of claim 7, wherein the digital demodulator demodulates the digital broadcast signal output by the analog-to-digital converter to restore a synchronous signal and then restore a transmitted symbol using the synchronous symbol.

14. The broadcast receiver of claim 13, wherein the demodulation of the digital broadcast signal is performed by a Vestigial Side Band (VSB) scheme.

15. The broadcast receiver of claim 13, wherein the digital demodulator comprises:
    a symbol restoration unit to receive a timing error signal of the present recovered symbols which are base band signal processed using a reproduction sampler, and to interpolate the digital broadcast signals received from the analog-to-digital converter by decreasing the error between the digital broadcast signals to obtain digital broadcast signals in synchronization with the symbols;
    a band pass matched filter (BFP) to filter the digital broadcast signals in synchronization with the symbols output by the symbol restoration unit;
    a phase separator to divide an I signal and a Q signal from the signal filtered by the BFP;
    a complex multiplier to receive carrier waves that are restored at a feed back point and to multiply the I and Q signals output by the phase separator by the carrier waves to lower the I and Q signals to a base band (base band signals);
    a carrier wave restoration unit to eliminate frequency offsets and phase noises of the carrier waves from the base band signals output by the complex multiplier and to provide carrier waves at the feed back point for feeding back to the complex multiplier;
    a channel equalizer to eliminate an inter-symbol interference due to multi-paths from the signal restored by the carrier wave restoration unit; and
    a channel decoder to eliminate channel noise from the signal output by the channel equalizer, and then to recover a synchronous signal from the base band I signal in which the synchronous signal was inserted in time of transmission, and to restore the transmitted symbol, or symbol data using the synchronous signal.

16. A channel management apparatus, comprising:
    an estimation apparatus to estimate an intensity and a signal-to-noise ratio (SNR) of broadcast signals received via a plurality of physical channels (PCT channels) in a channel memory mode;
    a determination apparatus to determine reception quality of the respective plurality of PCT channels, in consideration of both the estimated intensity and SNR of the broadcast signals, by multiplying the intensity and SNR values by first and second weight values, respectively, and combining the results; and
    an assignment apparatus to assign the plurality of PCT channels to a virtual channel (VCT channel) according to a predetermined rule with respect to a reception quality of the plurality of PCT channels.

17. The channel management apparatus of claim 16, wherein the estimation unit comprises:
    an auto gain control amplifier to perform automatic gain control on the broadcast signal with the intermediate frequency to amplify the broadcast signal to a fixed amplitude irrespective of the signal intensity;
    a signal intensity estimator to estimate the intensity of the broadcasts signals;
    an analog-to-digital converter to convert the broadcast signal in the analog form amplified by the auto gain control amplifier into a digital broadcast signal;
    a digital modulator to demodulate the digital broadcast signal output by the analog-to-digital converter to restore a synchronous signal and then restore a transmitted symbol using the synchronous symbol; and
    a signal-to-noise ratio apparatus to calculate the signal-to-noise of the symbol output by the digital modulator.

18. A non-transitory computer readable medium having computer-readable instructions that, when executed by a processor, perform a method of channel management in a broadcast receiver, the method comprising:
    estimating an intensity and a signal-to-noise ratio (SNR) of broadcast signals received via a plurality of physical channels (PCT channels) in a channel memory mode;
    determining reception quality of the respective plurality of PCT channels, in consideration of both the estimated intensity and SNR of the broadcast signals, by multiplying the intensity and SNR values by first and second weight values, respectively, and combining the results; and assigning the plurality of PCT channels to a virtual channel (VCT channel) according to a predetermined rule with respect to a reception quality of the plurality of PCT channels.

19. A non-transitory computer readable medium having computer-readable instructions that, when executed by a processor, perform a method of channel management in a broadcast receiver, the method comprising:

evaluating signal intensities and signal-to-noise ratios of broadcast signals carried on a plurality of physical channels (PCT channels); and assigning a reception channel, among the plurality of physical channels (PCT channels) evaluated, having the best quality to a virtual channel (VCT channel) in a multi-frequency network (MFN), wherein the best quality is determined based on signal intensity and signal-to-noise ratio by multiplying the intensity and signal-to-noise values by first and second weight values, respectively, and combining the results.

20. A channel management apparatus, comprising:

an evaluating apparatus to evaluate signal intensities and signal-to-noise ratios of received broadcast signals carried on a plurality of physical channels (PCT channels); and an assignment apparatus to assign a reception channel, among the plurality of received physical channels (PCT channels) evaluated, having the best quality to a virtual channel (VCT channel) in a multi-frequency network (MFN) that is determined based on signal intensity and signal-to-noise ratio by multiplying the intensity and signal-to-noise values by first and second weight values, respectively, and combining the results.

* * * * *